(12) United States Patent
Sano et al.

(10) Patent No.: US 11,909,360 B2
(45) Date of Patent: Feb. 20, 2024

(54) RADIO FREQUENCY CIRCUIT, COMMUNICATION DEVICE, AND ANTENNA MODULE

(71) Applicant: MURATA MANUFACTURING CO., LTD., Kyoto (JP)

(72) Inventors: Tomohiro Sano, Nagaokakyo (JP); Hirotsugu Mori, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/820,652

(22) Filed: Aug. 18, 2022

(65) Prior Publication Data
US 2022/0393646 A1  Dec. 8, 2022

Related U.S. Application Data

(63) Continuation of application No. 16/897,481, filed on Jun. 10, 2020, now Pat. No. 11,469,712.

(30) Foreign Application Priority Data

Jun. 13, 2019  (JP) ................................. 2019-110218

(51) Int. Cl.
| | | |
|---|---|---|
| *H03F 3/68* | (2006.01) | |
| *H03F 3/04* | (2006.01) | |
| *H03F 1/02* | (2006.01) | |
| *H03F 3/21* | (2006.01) | |

(Continued)

(52) U.S. Cl.
CPC ............. *H03F 1/0211* (2013.01); *H03F 3/21* (2013.01); *H04B 1/006* (2013.01); *H04B 1/04* (2013.01);
(Continued)

(58) Field of Classification Search
CPC ........ H03F 1/0211; H03F 3/21; H03F 1/0277; H03F 2200/111; H03F 2200/171;
(Continued)

(56) References Cited

U.S. PATENT DOCUMENTS

| | | | |
|---|---|---|---|
| 5,060,294 A | 10/1991 | Schwent et al. | |
| 5,774,017 A | * 6/1998 | Adar ......................... | H03F 3/24 |
| | | | 330/126 |

(Continued)

FOREIGN PATENT DOCUMENTS

| | | |
|---|---|---|
| CN | 103765784 A | 4/2014 |
| CN | 107800440 A | 3/2018 |

(Continued)

OTHER PUBLICATIONS

3GPP TSG-RAN WG4 Meeting 90, R4-1901356, Skyworks Solutions, Inc., Athens, Greece, Feb. 25,-Mar. 1, 2019.

*Primary Examiner* — Khanh V Nguyen
(74) *Attorney, Agent, or Firm* — Pearne & Gordon LLP

(57) ABSTRACT

A radio frequency circuit includes a power amplifier configured to selectively amplify one of a first radio frequency signal and a second radio frequency signal that have different bandwidths, and when the first radio frequency signal is input to the power amplifier, a first bias signal is applied to the power amplifier, and when the second radio frequency signal is input to the power amplifier, a second bias signal different from the first bias signal is applied to the power amplifier.

20 Claims, 5 Drawing Sheets

(51) Int. Cl.
*H04B 1/00* (2006.01)
*H04B 1/04* (2006.01)

(52) U.S. Cl.
CPC ...... *H03F 1/0277* (2013.01); *H03F 2200/111* (2013.01); *H03F 2200/171* (2013.01); *H03F 2200/451* (2013.01)

(58) Field of Classification Search
CPC ......... H03F 2200/451; H03F 2200/102; H03F 1/0227; H03F 3/19; H03F 2203/7209; H03F 3/245; H03F 3/68; H03F 2200/372; H03F 1/302; H03F 2200/18; H03F 1/301; H03F 3/04; H03F 1/0244; H03F 2200/504; H04B 1/006; H04B 1/04; H04B 1/0458; H04B 1/0475; H04B 1/40; H04B 2001/0408; H03G 3/3042; H03G 3/004; H03G 3/3047; H03G 3/3036
USPC ......... 330/51, 126, 127, 129, 136, 285, 297; 455/127.1, 127.4
See application file for complete search history.

(56) References Cited

U.S. PATENT DOCUMENTS

| | | | |
|---|---|---|---|
| 6,313,698 | B1 | 11/2001 | Zhang et al. |
| 6,788,151 | B2 | 9/2004 | Shvarts et al. |
| 6,839,549 | B2 * | 1/2005 | Pehlke .................. H03F 3/602 |
| | | | 455/116 |
| 7,110,730 | B2 * | 9/2006 | Okada ..................... H03F 1/30 |
| | | | 455/108 |
| 10,340,863 | B2 * | 7/2019 | Okabe ..................... H03F 1/56 |
| 2012/0064849 | A1 | 3/2012 | Langer et al. |
| 2018/0034152 | A1 | 2/2018 | Mura et al. |
| 2018/0069574 | A1 | 3/2018 | Kondo |
| 2018/0226923 | A1 | 8/2018 | Nagamori |

FOREIGN PATENT DOCUMENTS

| | | |
|---|---|---|
| CN | 108418558 A | 8/2018 |
| JP | 2015-050646 A | 3/2015 |

\* cited by examiner

RADIO FREQUENCY CIRCUIT, COMMUNICATION DEVICE, AND ANTENNA MODULE

CROSS REFERENCE TO RELATED APPLICATION

The present application is a continuation of U.S. application Ser. No. 16/897,481 filed on Jun. 10, 2020, which is based on and claims priority of Japanese Patent Application No. 2019-110218 filed on Jun. 13, 2019. The entire disclosure of the above-identified application, including the specification, drawings and claims is incorporated herein by reference in its entirety.

TECHNICAL FIELD

The present disclosure relates to a radio frequency circuit, and a communication device and an antenna module each including the radio frequency circuit.

BACKGROUND

U.S. Unexamined Patent Application Publication No. 2018/0034152 discloses a configuration of a transceiver front-end circuit (a radio frequency circuit) that includes a primary (main) circuit and a secondary (diversity) circuit.

If the radio frequency circuit disclosed in U.S. Unexamined Patent Application Publication No. 2018/0034152 is applied to a circuit that simultaneously transfers, for example, a radio frequency signal used in a fourth generation mobile communication system (4G) and a radio frequency signal used in a fifth generation mobile communication system (5G), it is assumed that the primary circuit is used as a transfer circuit for 4G, and the secondary circuit is used as a transfer circuit for 5G. In this case, circuit elements such as an amplifier for 4G are disposed in the primary circuit, and circuit elements such as an amplifier for 5G are disposed in the secondary circuit. Thus, circuit elements are disposed in each of the primary circuit and the secondary circuit, and this increases the number of circuit elements, resulting in an increase in the size of the radio frequency circuit. Further, also when the radio frequency circuit disclosed in U.S. Unexamined Patent Application Publication No. 2018/0034152 is applied to a circuit that simultaneously transfers, for example, radio frequency signals that are used in the same communication system, but have frequency ranges in different communication bands, circuit elements are disposed in each of the primary circuit and the secondary circuit, and thus the number of circuit elements increases, resulting in an increase in the size of the radio frequency circuit.

BRIEF SUMMARY

In view of the above, the present disclosure is to address the above problems, and provides a radio frequency circuit, a communication device, and an antenna module that are miniaturized and each include a smaller number of circuit elements such an amplifier.

In order to provide such a radio frequency circuit, a radio frequency circuit according to an aspect of the present disclosure includes an amplifier configured to selectively amplify one of a first radio frequency signal and a second radio frequency signal that have different bandwidths. When the first radio frequency signal is input to the amplifier, a first bias signal is applied to the amplifier, and when the second radio frequency signal is input to the amplifier, a second bias signal is applied to the amplifier, the second bias signal being different from the first bias signal.

According to the present disclosure, a radio frequency circuit, a communication device, and an antenna module that are miniaturized and each include a smaller number of circuit elements such an amplifier can be provided.

BRIEF DESCRIPTION OF DRAWINGS

These and other advantages and features will become apparent from the following description thereof taken in conjunction with the accompanying Drawings, by way of non-limiting examples of embodiments disclosed herein.

DETAILED DESCRIPTION

Figure 1:
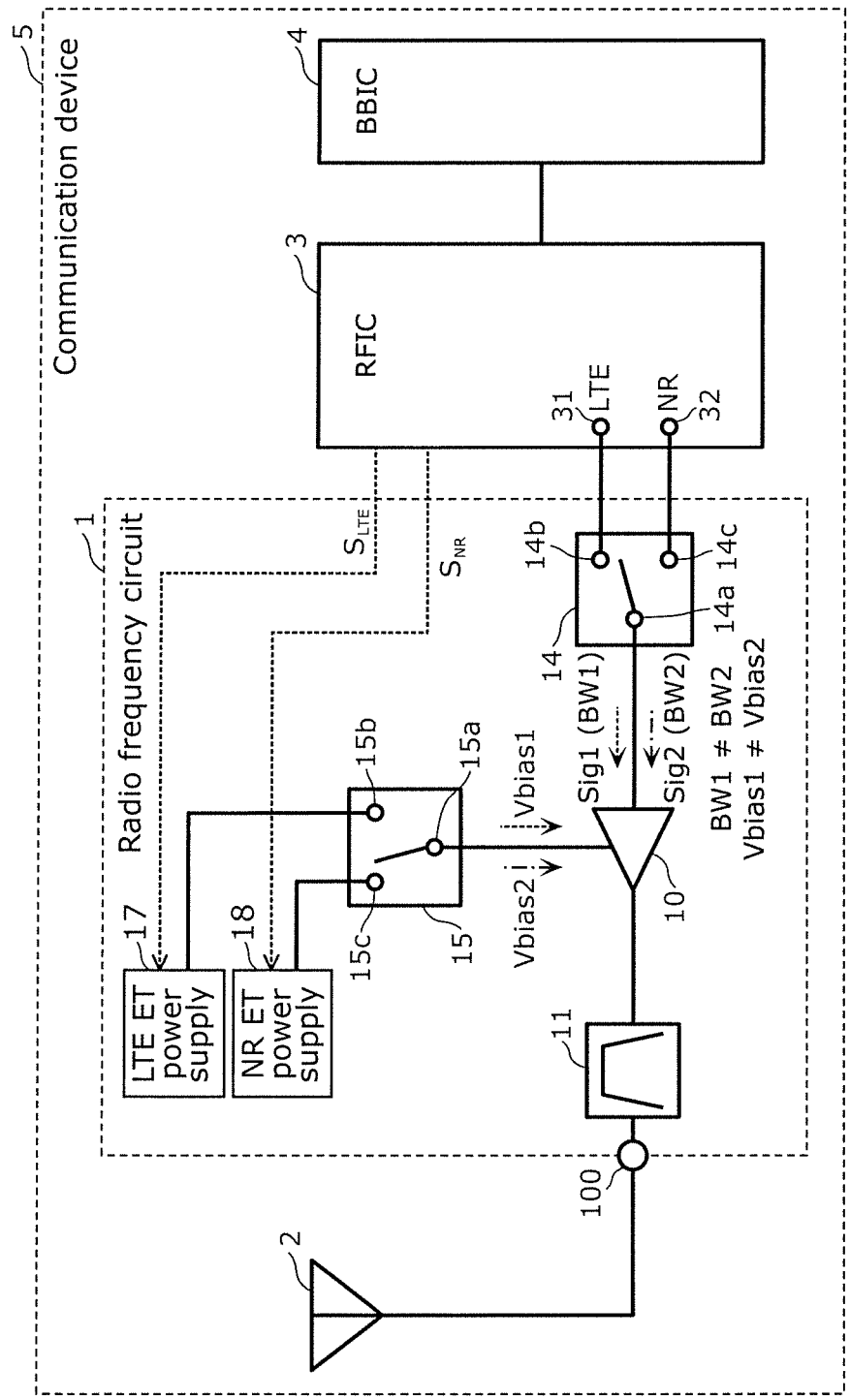
FIG. 1 illustrates a circuit configuration of a radio frequency circuit and a communication device according to Embodiment 1.

The following describes in detail embodiments of the present disclosure, with reference to the drawings. Note that the embodiments described below each show a general or specific example. The numerical values, shapes, materials, elements, the arrangement and connection of the elements, and others indicated in the following embodiments are mere examples, and therefore are not intended to limit the present disclosure. Thus, among the elements in the following embodiments, elements not recited in any independent claim are described as arbitrary elements. In addition, the sizes of elements and the ratios of the sizes illustrated in the drawings are not necessarily accurate.

Embodiment 1

FIG. 1 illustrates an example of a circuit configuration of radio frequency circuit 1 and communication device 5 according to Embodiment 1. As illustrated in FIG. 1, communication device 5 includes radio frequency circuit 1, antenna 2, radio frequency (RF) signal processing circuit (RF integrated circuit (IC)) 3, and baseband signal processing circuit (BBIC) 4.

Radio frequency circuit 1 includes antenna common terminal 100, power amplifier 10, filter 11, switches 14 and 15, Long Term Evolution (LTE) envelope tracking (ET) power supply 17, and New Radio (NR) ET power supply 18. Radio frequency circuit 1 is a transmitter circuit for transmitting a radio frequency signal generated by RFIC 3 through antenna 2.

Power amplifier 10 is an example of an amplifier, and can selectively amplify one of a first radio frequency signal (denoted by Sig1 and having bandwidth BW1) and a second radio frequency signal (denoted by Sig2 and having bandwidth BW2) that have different bandwidths. A bias signal is applied to power amplifier 10 to adjust amplification parameters such as a gain.

For example, the first radio frequency signal is a signal that is used in the fourth generation mobile communication system (4G), and is of a predetermined channel in communication band A used for Evolved Universal Terrestrial Radio Access (E-UTRA). Note that in this specification and the drawings, E-UTRA may be referred to as LTE. Note that communication band A above is Band 41 (a frequency band from 2496 MHz to 2690 MHz) for E-UTRA, for example.

For example, the second radio frequency signal is a signal that is used in the fifth generation mobile communication system (5G), and is of a predetermined channel in communication band B used for NR. Note that communication band B above is n41 (a frequency band from 2496 MHz to 2690 MHz) for NR, for example.

Specifically, the bandwidth of the first radio frequency signal used in 4G is a frequency range of the predetermined channel in the communication band used for E-UTRA, and the bandwidth of the second radio frequency signal used in 5G is a frequency range of the predetermined channel in a communication band used for NR.

Note that signals used in 4G and 5G include signals having frequency ranges not only in licensed bands, but also in unlicensed bands. Examples of the unlicensed bands include LTE-Licensed-Assisted Access (LAA), and NR-U. NR-U is 5G NR that uses 5 GHz or higher, which is defined by the Third Generation Partnership Project (3GPP), and corresponds to the Unlicensed National Information Infrastructure (U-NII) communication band within an unlicensed band defined by Federal Communications Commission (FCC).

5G signals may be transmitted in the extremely high frequency band (for example, n257). In this case, for example, the first radio frequency signal and the second radio frequency signal may be transmitted in n257 and n261 for 5G, respectively.

Further, one of the first radio frequency signal and the second radio frequency signal may be a wireless local area network (WLAN) IEEE802.11ac signal. In this case, one of LTE ET power supply 17 and ET NR power supply 18 may be a WLAN power supply.

Here, when the first radio frequency signal is input to power amplifier 10, a first bias signal is applied to power amplifier 10. On the other hand, when the second radio frequency signal is input to power amplifier 10, a second bias signal different from the first bias signal is applied to power amplifier 10.

According to this configuration, a different bias signal is applied to power amplifier 10 based on the bandwidth of an input radio frequency signal, and thus a bias signal is optimized based on the bandwidth of input radio frequency signals. Accordingly, the amplification performance of power amplifier 10 can be increased, and the power consumption thereof can be decreased, as compared with the case where the same bias signal is applied even if the bandwidths of input radio frequency signals are different. Consequently, radio frequency signals in different bandwidths can be amplified by single power amplifier 10, while the high amplification performance and low power consumption are ensured. Thus, radio frequency circuit 1 can be miniaturized.

LTE ET power supply 17 is an example of a first bias power supply circuit, and outputs a first bias signal for an ET mode (having bias voltage Vbias1) to power amplifier 10, based on control signal $S_{LTE}$ output by a controller of RFIC 3.

NR ET power supply 18 is an example of a second bias power supply circuit, and outputs a second bias signal for the ET mode (having bias voltage Vbias2) to power amplifier 10, based on control signal $S_{NR}$ output by the controller of RFIC 3.

LTE ET power supply 17 and NR ET power supply 18 are bias signal supply sources for causing power amplifier 10 to operate in an ET amplification mode. The ET amplification mode is for tacking a power amplitude (envelope) of an input radio frequency signal (or an output radio frequency signal) to/from power amplifier 10, and changing a bias signal (a direct current (DC) bias voltage or a DC bias current) supplied to power amplifier 10 based on the power amplitude.

Note that LTE ET power supply 17 may output a first bias signal for an average power tracking (APT) mode (with bias voltage Vbias1) to power amplifier 10, based on control signal $S_{LTE}$ output by the controller of RFIC 3.

Further, NR ET power supply 18 may output a second bias signal for the APT mode (with bias voltage Vbias2) to power amplifier 10, based on control signal $S_{NR}$ output by the controller of RFIC 3.

One of LTE ET power supply 17 and NR ET power supply 18 may output a bias signal for the APT mode, and the other of LTE ET power supply 17 and NR ET power supply 18 may output a bias signal for the ET mode. In this case, a ratio of peak power to average power of a signal input to a power amplifier (peak to average power ratio (PAPR) or an average power ratio) tends to be higher in the ET mode than in the APT mode.

Note that the APT mode (an amplification mode in accordance with APT) is for tracking an average power amplitude of a radio frequency signal calculated for each predetermined period, and changing, in line with the average power amplitude, a bias signal to be supplied to a power amplifier (a DC bias voltage or a DC bias current).

Switch 15 is an example of a first switch, and includes common terminal 15a and selection terminals 15b and 15c. Common terminal 15a is connected to power amplifier 10, selection terminal 15b is connected to LTE ET power supply 17, and selection terminal 15c is connected to NR ET power supply 18. This connection configuration allows switch 15 to switch between application of the first bias signal to power amplifier 10 and application of the second bias signal to power amplifier 10. Switch 15 is a single pole double throw (SPDT) switch, for example.

Switch 14 is an example of a second switch, and includes common terminal 14a and selection terminals 14b and 14c. Common terminal 14a is connected to an input terminal of power amplifier 10, selection terminal 14b is connected to LTE terminal 31 of RFIC 3, and selection terminal 14c is connected to NR terminal 32 of RFIC 3. According to this connection configuration, switch 14 switches between providing an input of the first radio frequency signal to power amplifier 10 and providing an input of the second radio frequency signal to power amplifier 10. Switch 14 is an SPDT switch, for example.

Filter 11 includes a first terminal connected to antenna common terminal 100, and a second terminal connected to an output terminal of power amplifier 10, and has a passband that includes a frequency range of the first radio frequency signal and a frequency range of the second radio frequency signal.

Antenna 2 is connected to antenna common terminal 100, and radiates radio frequency signals output from radio frequency circuit 1 through antenna common terminal 100.

RFIC 3 is an RF signal processing circuit that processes radio frequency signals, and includes LTE terminal 31 and NR terminal 32. Although not illustrated, RFIC 3 includes a signal processing circuit for LTE, and a signal processing circuit for NR. LTE terminal 31 is an example of a first output terminal, and is connected to the signal processing circuit for LTE. The first radio frequency signal is output through LTE terminal 31. NR terminal 32 is an example of a second output terminal, and is connected to the signal processing circuit for NR. The second radio frequency signal is output through NR terminal 32.

Specifically, RFIC 3 processes signals to be transmitted input from BBIC 4 by up-conversion, for instance, and outputs the first radio frequency signal and the second radio frequency signal generated by processing the signals to radio frequency circuit 1. RFIC 3 outputs control signal $S_{LTE}$ to LTE ET power supply 17, when the first radio frequency signal is output through LTE terminal 31, whereas RFIC 3 outputs control signal $S_{NR}$ to NR ET power supply 18 when the second radio frequency signal is output through NR terminal 32.

Note that in the present embodiment, RFIC 3 is an RF signal processing circuit formed into a single chip, which includes the signal processing circuit for LTE and the signal processing circuit for NR. However, in the communication device according to the present disclosure, the signal processing circuit for LTE and the signal processing circuit for NR may be formed into separate chips.

BBIC 4 is a signal processing circuit that processes a radio frequency signal, and is a circuit that processes signals using the intermediate frequency range lower than the frequency range of a radio frequency signal that propagates through radio frequency circuit 1. The signal processed by BBIC 4 is used as, for example, an image signal for image display, or an audio signal for talk through a loudspeaker.

According to the above configuration of radio frequency circuit 1, operation of amplifying the first radio frequency signal and operation of amplifying the second radio frequency signal are switched in power amplifier 10 in line with the switching operation of switches 14 and 15. More specifically, switches 14 and 15 synchronize inputting the first radio frequency signal to power amplifier 10 and applying the first bias signal to power amplifier 10 by switch 14 connecting common terminal 14a and selection terminal 14b and switch 15 connecting common terminal 15a and selection terminal 15b. Further, switches 14 and 15 synchronize inputting the second radio frequency signal to power amplifier 10 and applying the second bias signal to power amplifier 10 by switch 14 connecting common terminal 14a and selection terminal 14c and switch 15 connecting common terminal 15a and selection terminal 15c.

Since switches 14 and 15 are disposed, single power amplifier 10 can amplify the first radio frequency signal and the second radio frequency signal having different bandwidths, while high amplification performance and low power consumption are ensured. Specifically, radio frequency circuit 1 can be miniaturized by adding simple circuits, namely switches.

Note that a divider may be disposed instead of switch 14, in radio frequency circuit 1 according to Embodiment 1. The divider includes, for example, a common terminal and two divider terminals, divides power of a radio frequency signal input through the common terminal, and outputs the resultant power-divided radio frequency signals through the two divider terminals. Or conversely, the divider outputs, through the common terminal, radio frequency signals input through the two divider terminals. In the above divider, the common terminal is connected to the input terminal of power amplifier 10, a first divider terminal is connected to LTE terminal 31 of RFIC 3, and a second divider terminal is connected to NR terminal 32 of RFIC 3. This connection configuration allows the divider to receive the first radio frequency signal output from RFIC 3 through the first divider terminal, and output the first radio frequency signal to power amplifier 10. Further, this connection configuration also allows the divider to receive the second radio frequency signal output from RFIC 3 through the second divider terminal, and output the second radio frequency signal to power amplifier 10.

In this configuration, the operation of amplifying the first radio frequency signal and the operation of amplifying the second radio frequency signal in power amplifier 10 are switched in line with the operation of switching between output of the first radio frequency signal and output of the second radio frequency signal from RFIC 3.

Figure 2:
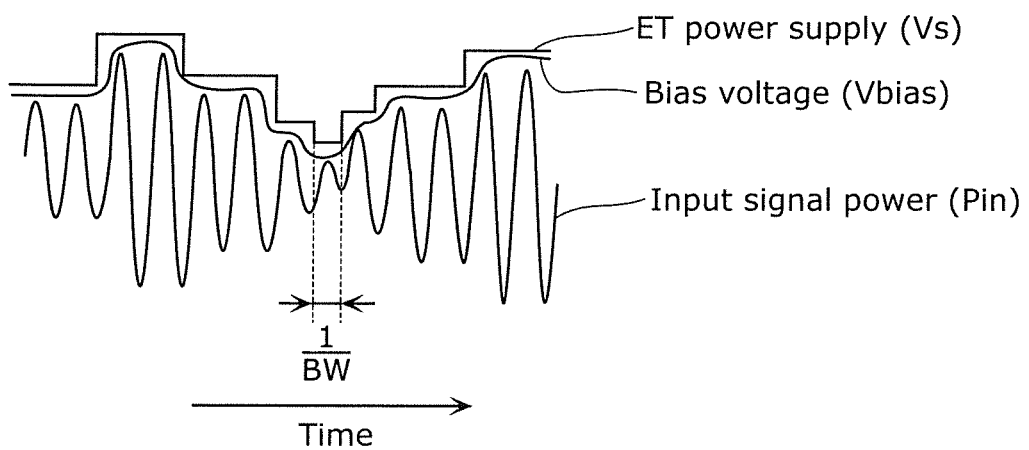
FIG. 2 is a waveform diagram illustrating a relation of input signal power, an envelope tracking (ET) power supply voltage, and a bias voltage.

FIG. 2 is a waveform diagram illustrating a relation of input signal power of a signal input to power amplifier 10, an ET power supply voltage, and a bias voltage. FIG. 2 illustrates a (carrier) power waveform (input signal power (Pin) in FIG. 2) of a radio frequency signal input to power amplifier 10, a power supply voltage (ET power supply voltage (Vs) in FIG. 2) of LTE ET power supply 17 and NR ET power supply 18, and a voltage waveform (bias voltage (Vbias) in FIG. 2) of a bias signal output from LTE ET power supply 17 and NR ET power supply 18.

In the radio frequency circuit that includes a power amplifier, power consumption of the power amplifier is a great portion of the power consumption of the radio frequency circuit, and thus an issue to be addressed is to increase efficiency of the power amplifier to reduce power consumption of the radio frequency circuit. The ET method is an example of a technique of increasing efficiency of the power amplifier. ET is a mode of tracking a power amplitude (envelope) of a radio frequency signal, and changing a bias signal (a DC bias voltage or a DC bias current) supplied to the power amplifier in line with the envelope. In particular, a PAPR is increased when a modulation scheme such as orthogonal frequency division multiplexing (OFDM) used for wireless communications is adopted. To amplify and transmit such a modulated signal, a bias voltage is applied to an amplification transistor included in the power amplifier so that the transistor operates in a compression region in response to an input signal at the time of peak power. Specifically, power consumption of the power amplifier can be decreased by changing the bias voltage based on a modulating signal input to the power amplifier to avoid an excessive bias voltage being applied at the time of average power. Note that in the case of ET, the power amplifier is caused to operate in the compression region, and thus the higher the tracking degree of a bias voltage tracking an input modulating signal is, the more likely an output signal is to exhibit severer distortion characteristics.

From the above viewpoint, LTE ET power supply 17 and NR ET power supply 18 each change an ET power supply voltage (Vs) in line with a power (Pin) amplitude of a radio frequency signal input to power amplifier 10, as illustrated in FIG. 2. Change in the ET power supply voltage (Vs) changes a bias voltage (Vbias) applied to power amplifier 10 so that the bias voltage tracks a power amplitude of input signal power (Pin) with a predetermined delay time.

Specifically, bias voltage Vbias1 of the first bias signal changes to track a change in the power amplitude of the first radio frequency signal at a first tracking degree, and bias voltage Vbias2 of the second bias signal changes to track a change in the power amplitude of the second radio frequency signal at a second tracking degree. Here, in the present embodiment, the first bias signal and the second bias signal being different means the first tracking degree and the second tracking degree being different, for example.

Table 1 illustrates results of comparing bandwidths, PAPRs, and tracking properties that are to be possessed, for different communication systems (4G and 5G). Table 1 also shows those of WLAN, for reference. The modulating scheme of WLAN is the same as that of 5G (orthogonal frequency division multiple access (OFDMA)), yet PAPR of WLAN may be different from that of 5G.

TABLE 1

| Communication system | Bandwidth (BW) | PAPR | Tracking degree to be possessed (Tracking performance) |
|---|---|---|---|
| 4G E-UTRA (LTE) | 20 MHz max | 6 dB @SC-FDMA | Lower than 5G |
| 5G NR | 100 MHz max | 9 dB @OFDMA | Lower than 4G |
| 802.11ac WLAN | 160 MHz max | 9-10 dB @OFDMA | Higher than 4G |

As illustrated in Table 1, a bandwidth for 5G is greater than that for 4G, and thus an amplitude change time indicated by the reciprocal of the bandwidth (1/BW) is shorter. A PAPR for 5G is greater than that for 4G. Specifically, if the bandwidth of a radio frequency signal input to power amplifier 10 is different, a PAPR differs. Note that the bandwidths shown in Table 1 are stated in TS 38.101-1, for example.

Accordingly, when the reciprocal of the bandwidth (1/BW) and a PAPR are different, the tracking degree (second tracking degree) of bias voltage Vbias2 tracking an input power amplitude in 5G is to be higher than the tracking degree (first tracking degree) of bias voltage Vbias1 tracking an input power amplitude in 4G.

According to this, when the 5G second radio frequency signals having a relatively wide bandwidth are input to power amplifier 10, the second bias signal having a higher tracking degree is applied to power amplifier 10, whereas when the 4G first radio frequency signals having a relatively narrow bandwidth are input to power amplifier 10, the first bias signal having a lower tracking degree is applied to power amplifier 10. Accordingly, a bias signal is optimized according to the bandwidth of a radio frequency signal that is input. Thus, power consumption can be reduced as compared with the case where the same first bias signal is applied even if the bandwidths of radio frequency signals that are input are different. Furthermore, distortion characteristics can be improved as compared with the case where the same second bias signal is applied even if the bandwidths of radio frequency signals that are input are different. Consequently, single power amplifier 10 can amplify radio frequency signals having different bandwidths, while high amplification performance and low power consumption are ensured. Furthermore, the amplified first radio frequency signal and the amplified second radio frequency signal pass through one filter 11 and are output through antenna common terminal 100. Accordingly, the number of amplifiers and the number of filters can be decreased, and thus radio frequency circuit 1 can be miniaturized.

Note that the tracking property (tracking performance) of a bias voltage tracking an input power amplitude is responsiveness of the bias voltage to a change in the power amplitude of a radio frequency signal input to power amplifier 10 (or output from power amplifier 10), and corresponds to, for example, a transition time of the bias voltage in step response (a rise time or a falling time). Stated differently, a higher tracking degree means quicker responsiveness and a shorter transition time.

Specifically, in radio frequency circuit 1 and communication device 5 according to the present embodiment in FIG. 1, when the first radio frequency signal having a relatively low PAPR is input to power amplifier 10, the first bias signal having a relatively low tracking degree is applied from LTE ET power supply 17 to power amplifier 10. On the other hand, when the second radio frequency signal having a relatively high PAPR is input to power amplifier 10, the second bias signal having a relatively high tracking degree is applied from NR ET power supply 18 to power amplifier 10.

Note that in view of the tracking property described above, in radio frequency circuit 1 and communication device 5 according to the present embodiment in FIG. 1, NR ET power supply 18 is desirably disposed closer to RFIC 3 than LTE ET power supply 17. NR ET power supply 18 is desirably disposed closer to power amplifier 10 than LTE ET power supply 17. According to this configuration, a control line that connects RFIC 3 and NR ET power supply 18, and a bias signal line that connects NR ET power supply 18 and power amplifier 10 can be made relatively short, and thus the tracking degree of the second bias signal that is to be higher than the tracking degree of the first bias signal can be improved.

The tracking degree (second tracking degree) of the second bias signal being higher than the tracking degree (first tracking degree) of the first bias signal means that the tracking degree of the second bias signal that NR ET power supply 18 outputs is higher than the tracking degree of the first bias signal that LTE ET power supply 17 outputs. In order to achieve this, for example, a dynamic range of bias voltage Vbias2 output from NR ET power supply 18 may be greater than the dynamic range of bias voltage Vbias1 output from LTE ET power supply 17. For example, the response speed based on a time from when NR ET power supply 18 detects control signal $S_{LTE}$ until when bias voltage Vbias2 is output may be lower than the response speed based on a time from when LTE ET power supply 17 detects control signal $S_{NR}$ until when bias voltage Vbias1 is output.

Note that in the present embodiment, signals used in 4G and 5G are used as examples of the first radio frequency signal and the second radio frequency signal having different bandwidths, yet the present embodiment is not limited thereto, and the modulation schemes for the first radio frequency signal and the second radio frequency signal may be different. In this case, the first radio frequency signal and the second radio frequency signal may be signals used in the same communication system (for example, both are 4G signals or both are 5G signals). An example is the case where the modulation scheme for the first radio frequency signal is single carrier frequency division multiple access (SC-FDMA), and the modulation scheme for the second radio frequency signal is OFDMA.

The communication system and the modulation scheme may be the same for the first radio frequency signal and the second radio frequency signal having different bandwidths, but the signals may have different PAPRs.

An example is the case where the first radio frequency signal is a signal of a first channel in communication band A for 4G (E-UTRA), and the second radio frequency signal is a signal of a second channel in communication band B for 4G (E-UTRA) having a passband width different from that of communication band A.

Another example is the case where the first radio frequency signal is a signal of a first channel in communication band C for 5G (NR), and the second radio frequency signal is a signal of a second channel in communication band D for 5G (NR) having a passband width different from that of communication band C.

Yet another example is the case where the first radio frequency signal is a signal of the first channel in communication band C for 5G (NR), and the second radio frequency signal is a signal of the second channel also in communication band C. In this case, a signal of the first channel in communication band C for 5G (NR) and a signal of the second channel in communication band C for 5G (NR) may have partially overlapping frequency ranges.

Figure 3:
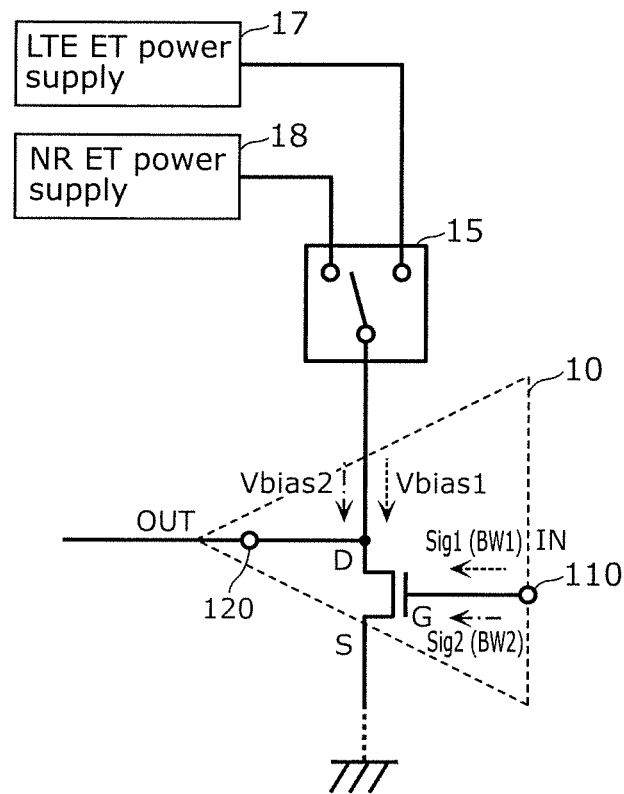
FIG. 3 is a circuit diagram illustrating an example of a circuit configuration of the power amplifier according to Embodiment 1.

FIG. 3 is a circuit diagram illustrating an example of a circuit configuration of power amplifier 10 according to Embodiment 1. As illustrated in FIG. 3, power amplifier 10 includes, for example, a field effect transistor (FET) that includes a gate (G), a drain (D), and source (S). The gate of the FET is connected to switch 14 (not illustrated in FIG. 3) via input terminal 110, the drain of the FET is connected to output terminal 120 and switch 15, and the source of the FET is connected to the ground.

The above configuration allows power amplifier 10 to amplify a radio frequency signal input through input terminal 110, and output the amplified radio frequency signal to output terminal 120. Here, when the first radio frequency signal is input to power amplifier 10, the first bias signal (bias voltage Vbias1) is applied from LTE ET power supply 17 to the drain of the FET via switch 15 and a bias input terminal (not illustrated in FIG. 3), whereas when the second radio frequency signal is input to power amplifier 10, the second bias signal (bias voltage Vbias2) is applied from NR ET power supply 18 to the drain of the FET via switch 15 and the bias input terminal (not illustrated in FIG. 3). Note that power amplifier 10 may include input terminal 110, output terminal 120, and the bias input terminal.

Note that the first bias signal and the second bias signal that are applied to power amplifier 10 are not limited to so-called bias power supply voltages applied to the drain of the FET. The first bias signal and the second bias signal that are applied to power amplifier 10 may be bias voltages applied to the gate of the FET together with a radio frequency signal. In this case, common terminal 15a of switch 15 is connected to the gate of the FET. The first bias signal and the second bias signal that are applied to power amplifier 10 may each be both a bias power supply voltage applied to the drain of the FET and a bias voltage applied to the gate of the FET.

Power amplifier 10 may have a configuration in which a plurality of FETs are cascaded. The transistor included in power amplifier 10 may be a bipolar transistor that includes a base, an emitter, and a collector. For example, the transistor included in power amplifier 10 may be a complementary metal oxide semiconductor (CMOS) transistor formed by the silicon on insulator (SOI) process, or may be a transistor made of GaAs or SiGe.

Note that filter 11, switches 14 and 15, LTE ET power supply 17, and NR ET power supply 18 are included in radio frequency circuit 1 according to the present embodiment, but are not necessarily essential to the radio frequency circuit according to the present disclosure.

In communication device 5 according to the present embodiment, antenna 2 and BBIC 4 are not necessarily essential.

The controller that outputs control signals $S_{LTE}$ and $S_{NR}$ may not be included in RFIC 3, may be included in BBIC 4, or may be included in communication device 5 other than RFIC 3 and BBIC 4.

In radio frequency circuit 1, power amplifier 10 and switches 14 and 15 may be formed in a semiconductor integrated circuit (IC). In other words, power amplifier 10 and switches 14 and 15 may be formed on the same IC substrate, and provided as a single chip. The semiconductor IC includes a CMOS, for example, and specifically formed by the SOI process. Accordingly, the semiconductor IC can be manufactured at a low cost. Note that the semiconductor IC may include at least one of GaAs, SiGe, or GaN. Thus, a radio frequency signal having high amplification quality and high noise quality can be output.

Power amplifier 10 may change a frequency range that can be amplified with a predetermined gain or more. Filter 11 may have a passband that can be changed.

Embodiment 2

Embodiment 1 has described an example of a configuration of radio frequency circuit 1 in which separate ET power supplies are disposed to output different bias signals, whereas Embodiment 2 describes an example of a configuration of radio frequency circuit 1A in which a single ET power supply that can output different bias signals is disposed.

Figure 4:
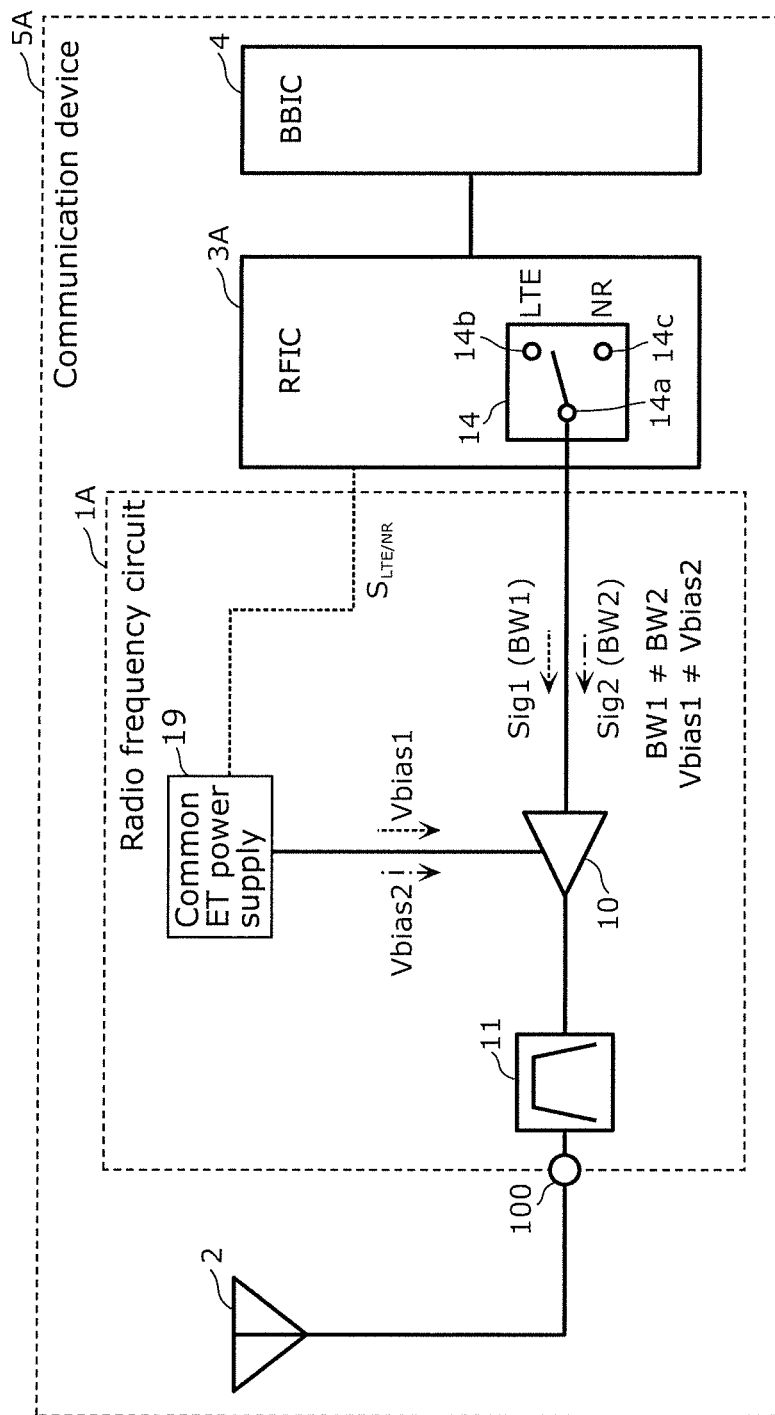
FIG. 4 illustrates a circuit configuration of a radio frequency circuit and a communication device according to Embodiment 2.

FIG. 4 illustrates a circuit configuration of radio frequency circuit 1A and communication device 5A according to Embodiment 2. As illustrated in FIG. 4, communication device 5A includes radio frequency circuit 1A, antenna 2, RFIC 3A, and BBIC 4. Communication device 5A according to the present embodiment in FIG. 4 is different from communication device 5 according to Embodiment 1 in FIG. 1, particularly, in the circuit configurations of radio frequency circuit 1A and RFIC 3A. In the following, description of the configuration of communication device 5A according to Embodiment 2 that is the same as that of communication device 5 according to Embodiment 1 is omitted, and a different configuration is mainly described.

RFIC 3A includes switch 14. Specifically, RFIC 3A has incorporated switch 14 into RFIC 3 according to Embodiment 1, and has a single output terminal for outputting radio frequency signals from RFIC 3A to radio frequency circuit 1A. In RFIC 3A, a terminal through which a first radio frequency signal is output is selection terminal 14b, and a terminal through which a second radio frequency signal is output is selection terminal 14c.

Radio frequency circuit 1A includes antenna common terminal 100, power amplifier 10, filter 11, and common ET power supply 19. Radio frequency circuit 1A according to the present embodiment is different from radio frequency circuit 1 according to Embodiment 1 in that switches 14 and 15 are not included, and common ET power supply 19 is disposed instead of LTE ET power supply 17 and NR ET power supply 18. In the following, description of the configuration of radio frequency circuit 1A according to Embodiment 2 that is the same as that of radio frequency circuit 1 according to Embodiment 1 is omitted, and a different configuration is mainly described.

Power amplifier 10 is an example of an amplifier, and can amplify the first radio frequency signal (denoted by Sig1 and having bandwidth BW1) and the second radio frequency signal (denoted by Sig2 and having bandwidth BW2) that have different bandwidths. A bias signal is applied to power amplifier 10 to adjust amplification parameters such as a gain.

For example, the first radio frequency signal is a signal that is used in 4G, and is of a predetermined channel in the communication band used for E-UTRA (LTE). For example, the second radio frequency signal is a signal that is used in 5G, and is of a predetermined channel in the communication band used for NR.

Here, when the first radio frequency signal is input to power amplifier 10, a first bias signal is applied to power amplifier 10. On the other hand, when the second radio frequency signal is input to power amplifier 10, a second bias signal different from the first bias signal is applied to power amplifier 10.

Common ET power supply 19 is an example of a bias power supply circuit, and outputs, to power amplifier 10, the first bias signal (bias voltage Vbias1) and the second bias signal (bias voltage Vbias2) for the ET mode, based on control signal $S_{LTE/NR}$ that a controller of RFIC 3A outputs.

When the first radio frequency signal is input to power amplifier 10 through common terminal 14a in response to switching operation of switch 14 included in RFIC 3A, the first bias signal is applied from common ET power supply 19 to power amplifier 10, based on control signal $S_{LTE/NR}$ (for example, a first digital value) from RFIC 3A. When the second radio frequency signal is input to power amplifier 10 through common terminal 14a in response to switching operation of switch 14, the second bias signal is applied from common ET power supply 19 to power amplifier 10, based on control signal $S_{LTE/NR}$ (for example, a second digital value) from RFIC 3A.

According to the above configurations of radio frequency circuit 1A and RFIC 3A, the operation of amplifying the first radio frequency signal by power amplifier 10 and the operation of amplifying the second radio frequency signal by power amplifier 10 are switched based on a radio frequency signal and control signal $S_{LTE/NR}$ output from RFIC 3A. More specifically, RFIC 3A synchronizes the input of the first radio frequency signal to power amplifier 10 and the output of control signal $S_{LTE/NR}$ (the first digital value), and synchronizes the input of the second radio frequency signal to power amplifier 10 and the output of control signal $S_{LTE/NR}$ (the second digital value).

According to this, when the 5G second radio frequency signal having a relatively wide bandwidth is input to power amplifier 10, the second bias signal having a higher tracking degree is applied to power amplifier 10, whereas when the 4G first radio frequency signal having a relatively narrow bandwidth is input to power amplifier 10, the first bias signal having a lower tracking degree is applied to power amplifier 10. Specifically, a bias signal is optimized based on the bandwidth of an input radio frequency signal. Accordingly, power consumption can be reduced as compared with the case where the same first bias signal is applied even if the bandwidths of input radio frequency signals are different. Furthermore, distortion characteristics can be improved as compared with the case where the same second bias signal is applied even if the bandwidths of input radio frequency signals are different. Moreover, the first bias signal and the second bias signal are output from single common ET power supply 19, and thus the ET power supply can be miniaturized. Accordingly, single power amplifier 10 can amplify radio frequency signals having different bandwidths, while high amplification performance and low power consumption are ensured. Thus, radio frequency circuit 1A and communication device 5A can be miniaturized.

Note that the first radio frequency signal and the second radio frequency signal may be output from RFIC 3A in a time-sharing manner achieved by switch 14, or may be input to power amplifier 10 being mixed (modulated) without using switch 14.

When the first radio frequency signal and the second radio frequency signal that are output from RFIC 3A are input to power amplifier 10 being mixed (modulated), a bias signal in response to control signal $S_{LTE/NR}$ (for example, a third digital value) output from RFIC 3A is applied to power amplifier 10. Here, a bias signal in response to control signal $S_{LTE/NR}$ (the third digital value) output from RFIC 3A is a signal obtained by mixing (modulating) a first bias signal component and a second bias signal component. Specifically, power amplifier 10 amplifies an input radio frequency signal obtained by mixing (modulating) the first radio frequency signal and the second radio frequency signal, using a bias signal obtained by mixing (modulating) the first bias signal component and the second bias signal component, so that the input radio frequency signal may be separated into a radio frequency signal obtained by amplifying the first radio frequency signal and a radio frequency signal obtained by amplifying the second radio frequency signal.

Note that RFIC 3A may not include switch 14. In this case, similar to RFIC 3 according to Embodiment 1, RFIC 3A may include LTE terminal 31 through which the first radio frequency signal is output, and NR terminal 32 through which the second radio frequency signal is output.

Figure 5:
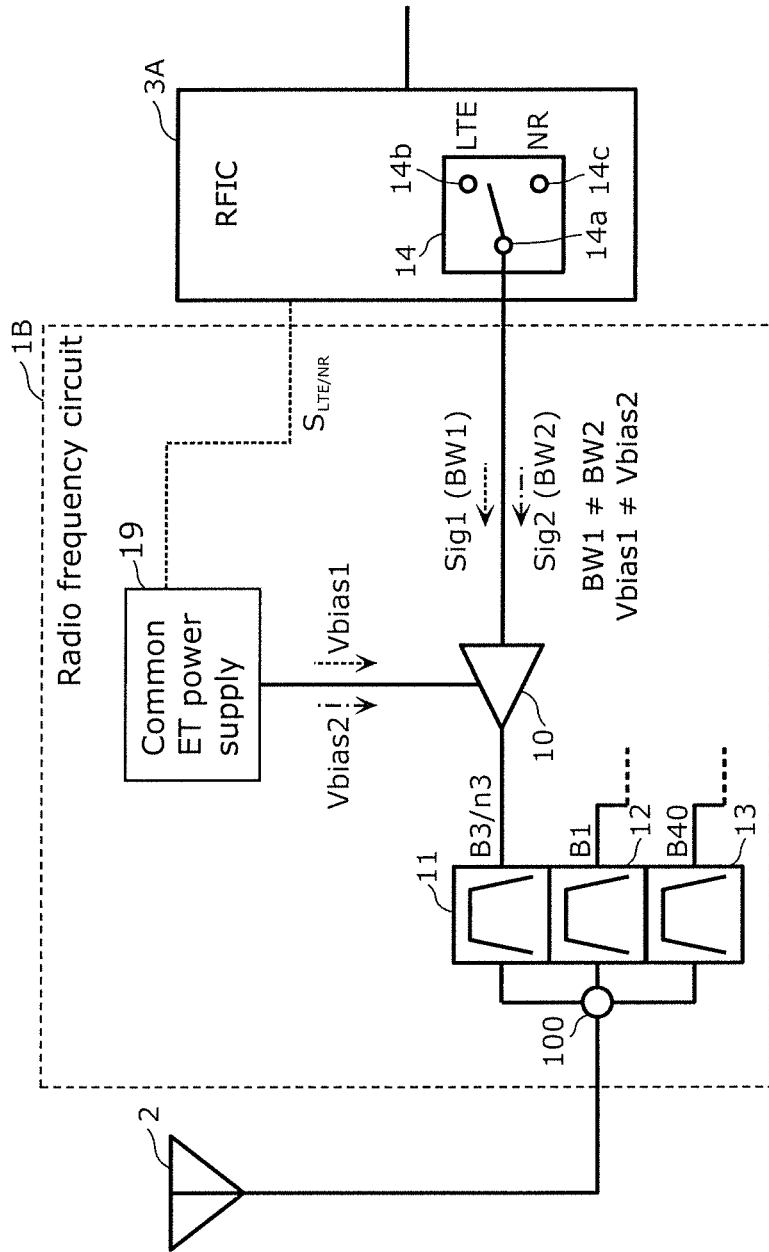
FIG. 5 illustrates a circuit configuration of a radio frequency circuit according to Variation 1 of Embodiment 2, and a peripheral circuit thereof.

FIG. 5 illustrates a circuit configuration of radio frequency circuit 1B according to Variation 1 of Embodiment 2, and a peripheral circuit thereof. As illustrated in FIG. 5, radio frequency circuit 1B includes antenna common terminal 100, power amplifier 10, filters 11, 12, and 13, and common ET power supply 19. Radio frequency circuit 1B according to this variation is different from radio frequency circuit 1A according to Embodiment 2 in that filters 12 and 13 are additionally included. In the following, description of a configuration of radio frequency circuit 1B according to this variation that is the same as that of radio frequency circuit 1A according to Embodiment 2 is omitted, and a different configuration is mainly described.

Filter 11 includes a first terminal connected to antenna common terminal 100 and a second terminal connected to the output terminal of power amplifier 10, and has a passband that includes the frequency range of the first radio frequency signal and the frequency range of the second radio frequency signal. Filter 11 has a passband that includes, for example, Band 3 for 4G (E-UTRA) (transmission band: 1710 MHz to 1785 MHz) and n3 for 5G (NR) (transmission band: 1710 MHz to 1785 MHz).

Filter 12 includes a first terminal connected to antenna common terminal 100, and has a passband different from the passband of filter 11. For example, the passband of filter 12 is Band 1 for 4G (E-UTRA) (transmission band: 1920 MHz to 1980 MHz).

Filter 13 includes a first terminal connected to antenna common terminal 100, and has a passband different from the passbands of filters 11 and 12. For example, the passband of filter 13 is Band 40 for 4G (E-UTRA) (band: MHz 2300 to 2400 MHz).

Filters 11, 12, and 13 are included in a multiplexer connected to antenna common terminal 100.

Although not illustrated in FIG. 5, a second terminal of filter 12 and a second terminal of filter 13 may be connected to power amplifiers.

Filters 11 to 13 and antenna common terminal 100 may not be directly connected, and may be connected via switches. The number of filters 11 to 13 is not limited to 3, and is arbitrarily determined.

The above configuration allows radio frequency circuit 1B not only to simultaneously transmit 4G and 5G signals using power amplifier 10 (EN-DC: E-UTRA-NR Dual Connectivity), but also to aggregate 4G carriers (for example, simultaneously transfer signals having frequency ranges in Band 3, Band 1, and Band 40).

Figure 6:
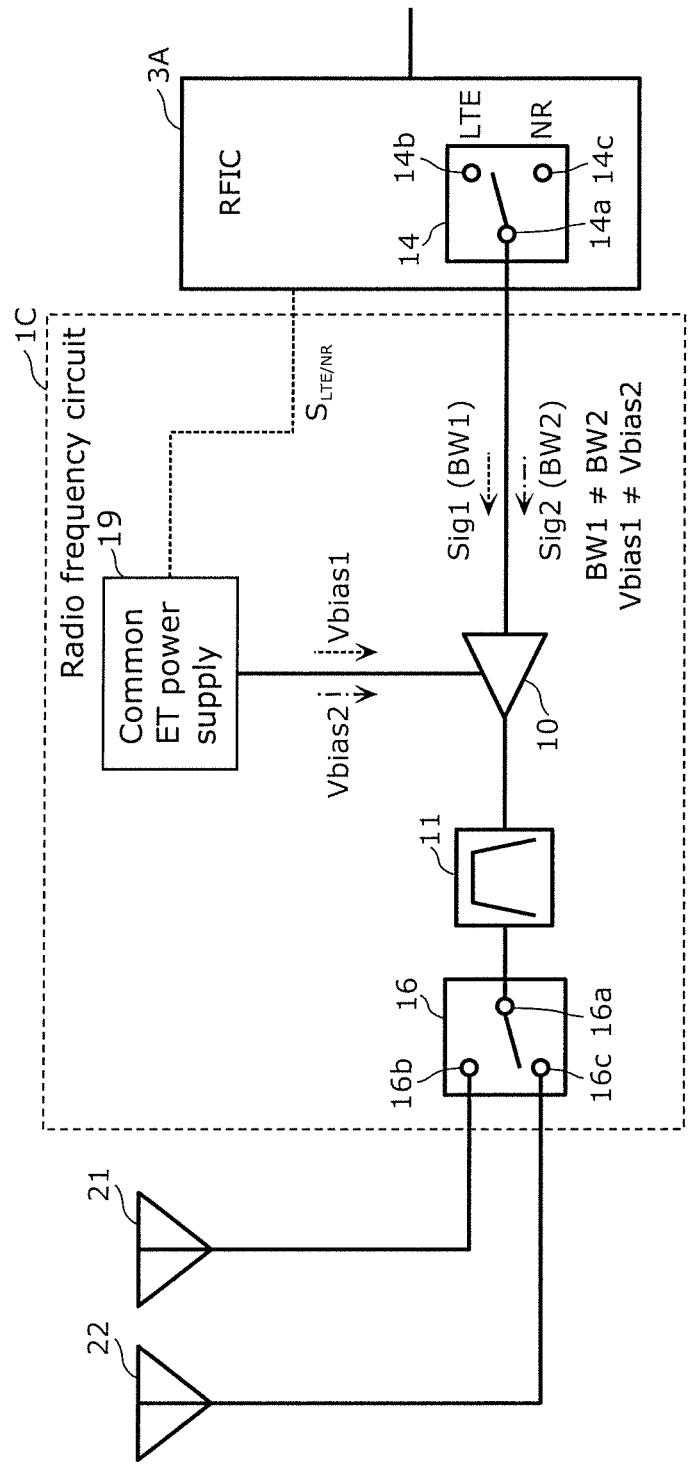
FIG. 6 illustrates a circuit configuration of a radio frequency circuit according to Variation 2 of Embodiment 2, and a peripheral circuit thereof.

FIG. 6 illustrates a circuit configuration of radio frequency circuit 1C according to Variation 2 of Embodiment 2, and a peripheral circuit thereof. As illustrated in FIG. 6, radio frequency circuit 1C includes switch 16, power amplifier 10, filter 11, and common ET power supply 19. Radio frequency circuit 1C according to this variation is different from radio frequency circuit 1A according to Embodiment 2 in that switch 16 is additionally included. In the following, description of a configuration of radio frequency circuit 1C according to this variation that is the same as that of radio frequency circuit 1A according to Embodiment 2 is omitted, and a different configuration is mainly described.

Switch 16 includes common terminal 16a and selection terminals 16b and 16c, common terminal 16a is connected to a first terminal of filter 11, selection terminal 16b is connected to antenna 21, and selection terminal 16c is connected to antenna 22. Switch 16 switches between connection of filter 11 to antenna 21 and connection of filter 11 to antenna 22. Switch 16 is an SPDT switch, for example.

In the above configuration, for example, when common terminal 14a and selection terminal 14b are connected, common terminal 16a and selection terminal 16b are connected, whereas when common terminal 14a and selection terminal 14c are connected, common terminal 16a and selection terminal 16c are connected. According to this, when the first radio frequency signal is input to power amplifier 10, antenna 21 radiates a radio frequency signal output from power amplifier 10, and when the second radio frequency signal is input to power amplifier 10, antenna 22 radiates a radio frequency signal output from power amplifier 10. Thus, isolation of an amplified signal resulting from the first radio frequency signal being amplified by power amplifier 10 from an amplified signal resulting from the second radio frequency signal being amplified by power amplifier 10 can be improved.

As described above, according to Embodiments 1 and 2, radio frequency circuit 1 includes power amplifier 10 configured to selectively amplify one of a first radio frequency signal and a second radio frequency signal that have different bandwidths. When the first radio frequency signal is input to power amplifier 10, a first bias signal is applied to power amplifier 10, and when the second radio frequency signal is input to power amplifier 10, a second bias signal is applied to power amplifier 10, the second bias signal being different from the first bias signal.

According to this, different bias signals are applied to power amplifier 10 based on the bandwidths of input radio frequency signals, and thus a bias signal can be optimized based on the bandwidth of an input radio frequency signal. Accordingly, amplification performance of power amplifier 10 can be increased and power consumption thereof can be decreased, as compared with the case where the same bias signal is applied even if the bandwidths of input radio frequency signals are different. Consequently, radio frequency signals having different bandwidths can be amplified by single power amplifier 10, while high amplification performance and low power consumption are ensured. Thus, radio frequency circuit 1 can be miniaturized.

The first bias signal may have a peak to average power ratio (PAPR) that is different from a PAPR of the second bias signal.

According to this, bias signals having different PAPRs are applied to power amplifier 10 based on the bandwidths of input radio frequency signals, and thus a bias signal can be optimized based on the bandwidth of an input radio frequency signal. Accordingly, radio frequency signals having different bandwidths can be amplified by single power amplifier 10, while high amplification performance and low power consumption are ensured. Thus, radio frequency circuit 1 can be miniaturized.

A bias voltage of the first bias signal may change to track a change in a power amplitude of the first radio frequency signal at a first tracking degree, and a bias voltage of the second bias signal may change to track a change in a power amplitude of the second radio frequency signal at a second tracking degree, the second tracking degree being different from the first tracking degree.

According to this, bias signals having different tracking degrees to track a power amplitude of a radio frequency signal are applied to power amplifier 10 based on the bandwidth of input radio frequency signals, and thus a bias signal can be optimized based on the bandwidth of an input radio frequency signal. Accordingly, radio frequency signals having different bandwidths can be amplified by single power amplifier 10, while high amplification performance and low power consumption are ensured. Thus, radio frequency circuit 1 can be miniaturized.

Radio frequency circuit 1 may further include switch 15 configured to switch between application of the first bias signal to power amplifier 10 and application of the second bias signal to power amplifier 10.

Radio frequency circuit 1 may further include switch 14 configured to switch between input of the first radio frequency signal to power amplifier 10 and input of the second radio frequency signal to power amplifier 10. Switch 14 and switch 15 may be configured to: synchronize the input of the first radio frequency signal to power amplifier 10 and the application of the first bias signal to power amplifier 10; and synchronize the input of the second radio frequency signal to power amplifier 10 and the application of the second bias signal to power amplifier 10.

Single power amplifier 10 can amplify the first radio frequency signal and the second radio frequency signal having different bandwidths, while high amplification performance and low power consumption are ensured. Specifically, radio frequency circuit 1 can be miniaturized by adding simple circuits, namely switches.

A modulation scheme for the first radio frequency signal and a modulation scheme for the second radio frequency signal may be different.

According to this configuration, different bias signals are applied to power amplifier 10 in accordance with the modulating schemes for input radio frequency signals, and thus a bias signal can be optimized accordance with the modulating scheme for an input radio frequency signal. Accordingly, radio frequency signals modulated using different modulating schemes can be amplified by single power amplifier 10, while high amplification performance and low power consumption are ensured. Thus, radio frequency circuit 1 can be miniaturized.

The first radio frequency signal may be used in a fourth generation mobile communication system (4G), and the second radio frequency signal may be used in a fifth generation mobile communication system (5G).

Accordingly, 4G-5G EN-DC can be performed using a miniaturized configuration achieved by single power amplifier 10.

The first radio frequency signal may be used in a fourth generation mobile communication system (4G), and the second radio frequency signal may be used in a wireless local area network (WLAN).

The first radio frequency signal may be used in a fifth generation mobile communication system (5G), and the second radio frequency signal may be used in the 5G.

The first radio frequency signal may be used in a fifth generation mobile communication system (5G), and the second radio frequency signal may be used in a wireless local area network (WLAN).

The PAPR of the first bias signal may be lower than the PAPR of the second bias signal.

According to this, when the 5G second radio frequency signal having a relatively wide bandwidth is input to power amplifier 10, the second bias signal having a higher PAPR is applied to power amplifier 10, whereas when the 4G first radio frequency signal having a relatively narrow bandwidth is input to power amplifier 10, the first bias signal having a lower PAPR is applied to power amplifier 10. Accordingly, a bias signal is optimized based on the bandwidth of an input radio frequency signal. Thus, power consumption can be reduced as compared with the case where the same first bias signal is applied even if the bandwidths of input radio frequency signals are different. Furthermore, distortion characteristics can be improved as compared with the case where the same second bias signal is applied even if the bandwidths of input radio frequency signals are different. Accordingly, single power amplifier 10 can amplify radio frequency signals having different bandwidths, while high amplification performance and low power consumption are ensured. Thus, radio frequency circuit 1 can be miniaturized.

According to Embodiment 2, radio frequency circuit 1A may further include: common ET power supply 19 configured to output the first bias signal and the second bias signal to power amplifier 10.

Accordingly, the first bias signal and the second bias signal are output from single common ET power supply 19, and thus the ET power supply can be miniaturized. Consequently, radio frequency circuit 1A and communication device 5A can be miniaturized.

According to Embodiment 1, radio frequency circuit 1 may further include LTE ET power supply 17 configured to output the first bias signal to power amplifier 10; and NR ET power supply 18 configured to output the second bias signal to power amplifier 10.

Radio frequency circuit 1 may further include filter 11 connected to an output terminal of power amplifier 10, and having a passband that includes a frequency range of the first radio frequency signal and a frequency range of the second radio frequency signal.

Accordingly, the quality of radio frequency signals to be transmitted which are output from power amplifier 10 can be improved.

Communication device 5 includes RFIC 3 configured to process a radio frequency signal, and radio frequency circuit 1 configured to input the radio frequency signal processed by RFIC 3.

Accordingly, miniaturized communication device 5 that can amplify a plurality of radio frequency signals having different bandwidths using single power amplifier 10 can be provided.

RFIC 3 may include LTE terminal 31 through which the first radio frequency signal is output to radio frequency circuit 1, and NR terminal 32 through which the second radio frequency signal is output to radio frequency circuit 1.

Other Embodiments

The above has described the radio frequency circuits and the communication devices according to the embodiments using the embodiments and variations thereof, yet the radio frequency circuit and the communication device according to the present disclosure are not limited to the above embodiments and the variations thereof. The present disclosure also encompasses other embodiments achieved by combining arbitrary elements in the above embodiments and the variations thereof, variations as a result of applying, to the embodiments and the variations thereof, various modifications that may be conceived by those skilled in the art without departing from the scope of the present disclosure, and also various apparatuses that include the radio frequency circuit and the communication device according to the present disclosure.

Note that the radio frequency circuits and the communication devices according to the above embodiments are typically applied to a system that simultaneously transfers a 4G (E-UTRA) radio frequency signal and a 5G (NR) radio frequency signal, as described above. Examples of a combination of communication band A for E-UTRA and communication band B for NR include (1) Band 41 and n41 stated in Embodiment 1, and (2) Band 20 (transmission band: 832 MHz to 862 MHz, receiving band: 791 MHz to 821 MHz) and n28 (transmission band: 703 MHz to 748 MHz, receiving band: 758 MHz to 803 MHz).

The radio frequency circuits and the communication devices according to the above embodiments are applicable not only to the combinations of communication bands A and B that have at least partially overlapping frequency ranges such as (1) and (2) above, but also to a system that simultaneously transfers radio frequency signals having frequency ranges in two communication bands that do not have overlapping frequency ranges.

Furthermore, the present disclosure also encompasses an antenna module that includes radio frequency circuit 1, and antenna 2 that radiates a radio frequency signal output from radio frequency circuit 1. Accordingly, a miniaturized antenna module that can amplify, with single power amplifier 10, a plurality of radio frequency signals having different bandwidths can be provided. When the radio frequency signals have the extremely high frequency range, an antenna module can be further miniaturized by including antenna 2.

The above embodiments and variations thereof have described, as an example, a configuration adopted when two signals having different bandwidths are transmitted, namely the first radio frequency signal and the second radio frequency signal, yet the configuration of the radio frequency circuit and the communication device according to the present disclosure is also applicable to the configuration adopted when three or more radio frequency signals having different bandwidths are transmitted. Thus, the present disclosure also encompasses a radio frequency circuit and a communication device that are configured to transmit three or more radio frequency signals having different bandwidths, and have the configuration of any of the radio frequency circuits and the communication devices according to the above embodiments and the variations thereof.

Furthermore, for example, in the radio frequency circuits and communication devices according to the above embodiments and the variations thereof, radio frequency circuit elements and lines, for instance, may be interposed between circuit elements and paths that connect signal paths illustrated in the drawings.

The controller according to the present disclosure may be achieved as an IC or a large scale integrated circuit (LSI). Furthermore, a dedicated circuit or a general-purpose processor may perform the method of circuit integration. A field programmable gate array (FPGA) that can be programmed after manufacturing LSIs or a reconfigurable processor that can re-configure the connection and setting of a circuit cell inside an LSI may be used. In addition, if advancement in semiconductor technology or other derivative technology achieves circuit integration technology that replaces LSI, the functional blocks may of course be integrated using such a technology.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

The present disclosure can be widely used in communication apparatuses such as mobile phones as a multi-band/multi-mode front-end module that adopts EN-DC, in particular.

The invention claimed is:

1. A radio frequency circuit, comprising:
   an amplifier configured to amplify radio frequency signals having different bandwidths;
   a first switch configured to switch between application of a first bias signal to the amplifier and application of a second bias signal to the amplifier,
   wherein bias voltages of the first and second bias signals applied to the amplifier track a change in a power amplitude of the radio frequency signal amplified by the amplifier,
   wherein a degree of tracking the change in the power amplitude corresponds to a bandwidth of the radio frequency signal amplified by the amplifier, and
   wherein the first bias signal changes to track the change in power amplitude at a different degree than the second bias signal.

2. The radio frequency circuit according to claim 1, wherein a peak to average power ratio of at least one of the bias signals corresponds to the bandwidth of the radio frequency signal amplified by the amplifier.

3. The radio frequency circuit according to claim 1, further comprising:
   a second switch configured to switch between providing an input of a first radio frequency signal to the amplifier and providing an input of a second radio frequency signal to the amplifier, the first radio frequency signal having a different bandwidth than the second radio frequency signal,
   wherein the first switch and the second switch are configured to:
      synchronize the input of the first radio frequency signal to the amplifier and the application of the first bias signal to the amplifier; and
      synchronize the input of the second radio frequency signal to the amplifier and the application of the second bias signal to the amplifier.

4. The radio frequency circuit according to claim 1, wherein a modulation scheme of the amplifier corresponds to the bandwidth of the radio frequency signal amplified by the amplifier.

5. The radio frequency circuit according to claim 4,
   wherein the modulation scheme for a first radio frequency signal amplified by the amplifier is based on a fourth generation mobile communication system (4G), and
   wherein the modulation scheme for a second radio frequency signal amplified by the amplifier is based on a fifth generation mobile communication system (5G).

6. The radio frequency circuit according to claim 4,
   wherein the modulation scheme for a first radio frequency signal amplified by the amplifier is based on a fourth generation mobile communication system (4G), and
   wherein the modulation scheme for a second radio frequency signal amplified by the amplifier is based on a wireless local area network (WLAN).

7. The radio frequency circuit according to claim 4,
   wherein the modulation scheme for a first radio frequency signal amplified by the amplifier is based on a fifth generation mobile communication system (5G), and
   wherein the modulation scheme for a second radio frequency signal amplified by the amplifier is based on the 5G.

8. The radio frequency circuit according to claim 4,
   wherein the modulation scheme for a first radio frequency signal amplified by the amplifier is based on a fifth generation mobile communication system (5G), and
   wherein the modulation scheme for a second radio frequency signal amplified by the amplifier is based on a wireless local area network (WLAN).

9. The radio frequency circuit according to claim 1, further comprising:
   a bias power supply circuit configured to output at least one of the bias signals to the amplifier.

10. The radio frequency circuit according to claim 1, further comprising:
    a first bias power supply circuit configured to output the first bias signal to the amplifier; and
    a second bias power supply circuit configured to output the second bias signal to the amplifier.

11. The radio frequency circuit according to claim 1, further comprising:
    a filter connected to an output terminal of the amplifier, and having a passband that includes a frequency range of a first radio frequency signal amplified by the amplifier and a frequency range of a second radio frequency signal amplified by the amplifier, the first radio frequency signal having a different bandwidth than the second radio frequency signal.

12. A communication device, comprising:
    a signal processing circuit configured to process a radio frequency signal; and
    the radio frequency circuit according to claim 1 configured to receive the radio frequency signal processed by the signal processing circuit.

13. The communication device according to claim 12, wherein the signal processing circuit comprises:
    a first output terminal through which a first radio frequency signal amplified by the amplifier is output to the radio frequency circuit; and a second output terminal through which a second radio frequency signal amplified by the amplifier is output to the radio frequency circuit, wherein the first radio frequency signal has a different bandwidth than the second radio frequency signal.

14. An antenna module, comprising:

the radio frequency circuit according to claim 1; and an antenna configured to radiate amplified radio frequency signals output from the radio frequency circuit.

15. A radio frequency circuit, comprising:

an amplifier configured to amplify radio frequency signals having different bandwidths, wherein a bias voltage of a bias signal applied to the amplifier tracks a change in a power amplitude of the radio frequency signal amplified by the amplifier, wherein a degree of tracking the change in the power amplitude corresponds to a bandwidth of the radio frequency signal amplified by the amplifier, wherein a modulation scheme of the amplifier corresponds to the bandwidth of the radio frequency signal amplified by the amplifier, wherein the modulation scheme for a first radio frequency signal amplified by the amplifier is based on a fourth generation mobile communication system (4G), wherein the modulation scheme for a second radio frequency signal amplified by the amplifier is based on a wireless local area network (WLAN), and wherein a peak to average power ratio (PAPR) of the bias signal when the first radio frequency signal is amplified by the amplifier is lower than the PAPR of the bias signal when the second radio frequency signal is amplified by the amplifier.

16. A radio frequency circuit, comprising:

an amplifier configured to amplify radio frequency signals having different bandwidths;

a first bias power supply circuit configured to output a first bias signal to the amplifier; and a second bias power supply circuit configured to output a second bias signal to the amplifier, wherein bias voltages of the first and second bias signals applied to the amplifier tracks a change in a power amplitude of the radio frequency signal amplified by the amplifier, wherein a degree of tracking the change in the power amplitude corresponds to a bandwidth of the radio frequency signal amplified by the amplifier, and wherein the first bias signal changes to track the change in power amplitude at a different degree than the second bias signal.

17. The radio frequency circuit according to claim 16, wherein a peak to average power ratio of at least one of the bias signals corresponds to the bandwidth of the radio frequency signal amplified by the amplifier.

18. The radio frequency circuit according to claim 16, further comprising:

a second switch configured to switch between providing an input of a first radio frequency signal to the amplifier and providing an input of a second radio frequency signal to the amplifier, the first radio frequency signal having a different bandwidth than the second radio frequency signal, wherein the second switch is configured to:

synchronize the input of the first radio frequency signal to the amplifier and the application of the first bias signal to the amplifier; and synchronize the input of the second radio frequency signal to the amplifier and the application of the second bias signal to the amplifier.

19. The radio frequency circuit according to claim 16, wherein a modulation scheme of the amplifier corresponds to the bandwidth of the radio frequency signal amplified by the amplifier.

20. The radio frequency circuit according to claim 16, further comprising:

a filter connected to an output terminal of the amplifier, and having a passband that includes a frequency range of a first radio frequency signal amplified by the amplifier and a frequency range of a second radio frequency signal amplified by the amplifier, the first radio frequency signal having a different bandwidth than the second radio frequency signal.

* * * * *